United States Patent
Döttling et al.

(10) Patent No.: US 7,280,609 B2
(45) Date of Patent: Oct. 9, 2007

(54) METHOD FOR MATCHING THE BIT RATE OF A BIT STREAM WHICH IS TO BE TRANSMITTED IN A COMMUNICATION SYSTEM AND CORRESPONDING COMMUNICATION DEVICE

(75) Inventors: Martin Döttling, Neubiberg (DE); Bernhard Raaf, Neuried (DE)

(73) Assignee: Siemens Aktiengesellschaft, Munich (DE)

( * ) Notice: Subject to any disclaimer, the term of this patent is extended or adjusted under 35 U.S.C. 154(b) by 531 days.

(21) Appl. No.: 10/488,810

(22) PCT Filed: Sep. 3, 2002

(86) PCT No.: PCT/DE02/03246

§ 371 (c)(1),
(2), (4) Date: Mar. 5, 2004

(87) PCT Pub. No.: WO03/024014

PCT Pub. Date: Mar. 20, 2003

(65) Prior Publication Data

US 2004/0257992 A1    Dec. 23, 2004

(30) Foreign Application Priority Data

Sep. 5, 2001 (DE) ................................ 101 43 497

(51) Int. Cl.
    *H04L 27/04* (2006.01)
(52) U.S. Cl. ..................................... 375/295
(58) Field of Classification Search .............. 375/225, 375/253, 246, 259, 222, 295; 714/790
See application file for complete search history.

(56) References Cited

U.S. PATENT DOCUMENTS

| 7,082,565 B1 * | 7/2006 | Michel et al. ............. 714/790 |
| 2003/0007476 A1 * | 1/2003 | Kim et al. ................ 370/342 |
| 2003/0031233 A1 * | 2/2003 | Kim et al. ................ 375/146 |

FOREIGN PATENT DOCUMENTS

| WO | WO 00/65726 | 11/2000 |
| WO | WO 01/39420 | 5/2001 |
| WO | WO 01/39422 | 5/2001 |

OTHER PUBLICATIONS

XP-002229383 Panasonic: "Enhanced HARQ Method with Signal Constellation Rearrangement", Mar. 2, 2001.

* cited by examiner

*Primary Examiner*—Don N. Vo
(74) *Attorney, Agent, or Firm*—Bell Boyd & Lloyd LLP

(57) ABSTRACT

A method and communication device are provided for matching the bit rate of a bit stream to be transmitted in a communication system. For bit rate matching in a communication system the bits of a bit stream are punctured or repeated so that for a specific number (N) of consecutive bits (x) of the bit stream to be transmitted, the sum of the importances (w) of the bit stream which features the relevant bits (x) of the bit stream for a recovery of a message containing the relevant bit are in a specific relationship to the sum of the reliabilities (v) of the corresponding bits actually used for transmission (y) with which these bits after execution of bit rate matching can transfer a specific information content.

20 Claims, 3 Drawing Sheets

(100)   $e = e_{ini}$ (101)   $m = 1$
(102)   $n = 1$
(103)   do while $m <= N$
(104)       $e = e - e_{minus}(m)$
(105)       do while $e <= 0$
(106)           select bit for transmission
(107)           $e = e + e_{plus}(n)$
(108)           $n = n + 1$
            end do
(109)       $m = m + 1$
        end do

METHOD FOR MATCHING THE BIT RATE OF A BIT STREAM WHICH IS TO BE TRANSMITTED IN A COMMUNICATION SYSTEM AND CORRESPONDING COMMUNICATION DEVICE

BACKGROUND OF THE INVENTION

The present invention relates to a method for matching the bit rate of a bit stream to be transmitted in a communication system, particularly a mobile radio system, and further relates to a corresponding communication device.

The area of mobile radio technology is undergoing rapid development. Right now work is underway on standardization of what is known as the UMTS ("Universal Mobile Telecommunication System") mobile radio standard for third-generation mobile radio terminals.

Such standard involves performing rate matching on the transmitter side in order to match the bit rate of the bit stream to be transmitted to the possible transmission rate, in which bits are either removed from the bit stream or multiplexed in the bit stream; in particular, duplicated. The removal of bits is referred to as puncturing and the multiplexing of bits as "repetition".

A possible layout of the transmission path for which this type of bit rate matching is envisaged is shown in an example in FIG. 1.

A data stream including a number of data or transport blocks is first expanded by a device by what are known as "tail bits." The bit stream thus output by device 1 is fed to a channel coder 2 where redundant bits are added to the information bits depending on the type of channel coding applied. As such, with most coding schemes, what are known as systematic bits are created on one side and parity bits on the other side. Depending on the coding rate of the channel coder 2, a greater or lesser number of systematic bits or parity bits are produced. In a few coding schemes, the parity bits are given lower priority or importance for decoding the corresponding message than the systematic bits. In UMTS mobile radio systems, channel coder 2 can, for example, be what is known as a turbo coder, which as a rule is constructed of nested folding coders.

A bit rate matching device 3 is connected downstream of channel coder 2 which punctures and/or repeats the bits fed to it in accordance with a specific bit rate matching algorithm. Because of the lesser importance or priority of the parity bits, the parity bits are preferably punctured for bit rate matching, since these are of less importance for successful decoding of the relevant message on the receiver side than the systematic bits.

The bit stream output by the bit rate matching device 3 is scrambled with the aid of an interleaver 4, so that the timing order of the individual bits is changed in accordance with a specific interleaving scheme. The result of processing by the interleaver 4 is that, for the bit stream outputted, the priorities of the individual bits are no longer known.

The bits outputted by the interleaver 4 are fed to a modulator 5 which, depending on the type of modulation used, maps several of these bits to specific symbols of a multidimensional symbol space and transmits the symbols to a receiver. With QPSK ("Quadrature Phase Shift Keying") modulation, two bits are distributed in each case over four symbols equally spaced in a two-dimensional symbol space; whereas with 8PSK modulation three bits, are distributed with 16QAM (Quadrature Amplitude Modulation) four bits are distributed, and with 64QAM modulation six bits are assigned to a symbol in a two-dimensional symbol space.

The symbols generated by modulator 5 are transmitted in the form of a real and an imaginary part, which uniquely describe the position of the relevant symbol in the two-dimensional symbol space. A demultiplexer 7 connected downstream of modulator 5 distributes the systems possibly over a number of channels, where the sequence of symbols is encoded with different channelization or spread codes $W_1 \ldots W_M$, which is shown in FIG. 1 in the form of a corresponding multiplexer 8. The sum signal of the different channel-coded symbol sequences is generated and output via a summator 9.

In addition, in accordance with FIG. 1, provision is made for a control unit 6 operating in accordance with AMCS ("Adaptive Modulation and Coding Schemes"), which defines the modulation alphabet of the modulator 5, as well as the encoding schemes and code rates of channel coder 2 and the distribution between the individual channelizing codes by the demultiplexer 7 to be used.

The transmit path structure shown in FIG. 1 corresponds, for example to the structure of the physical layer provided for what is known as HSDPA ("High Speed Downlink Packet Access") in UMTS mobile radio systems. This involves a packet-switched connection type, in which case what is known as an ARQ ("Automatic Repeat Request") method also can be used, in which case the receiver (for example, a mobile station) of a data packet, if this data packet is not received correctly, requests a repeat transmission of the packet by the transmitter (for example, a base station), after which the transmitter sends a repetition of the originally sent data packet to the receiver.

A problem with the function of the modulator shown in FIG. 1 is that, because of the type of modulation selected in each case, not all the bits directed to modulator 5 can be transmitted with equal security; (i.e., the reliability of the individual bits fluctuates, depending, for example, on the position of the symbol in the symbol space to which the individual bits will be mapped).

This will be explained in more detail below with reference to FIG. 6, which shows an example of the signal constellation of the two-dimensional symbol space 12 for a 16QAM modulation. In this diagram, four bits $i_1$, $q_1$, $i_2$ and $q_2$ are assigned in the specified order to a symbol 13 of the two-dimensional symbol space 12 shown in FIG. 6, in which case the type of mapping of the individual bits to the symbols 13 is referred to as "gray mapping." In FIG. 6, the columns or rows of symbols are marked with a dash, in each case, which corresponds to a bit $i_1$ or $i_2$ or $q_1$ or $q_2$ with the value "1." It can be seen from the diagram that, for example, the symbols with $i_2$ "1" each have eight neighbors with the value $i_2$="0," whereas symbols with $i_1$="1" only have four potential neighbors with $i_1$="0" and, thus, only four direct decision thresholds. The result of this is that the symbols with the bits $i_1$="1" are better protected from incorrect transmission than symbols with $i_2$="1." The same also applies, for example to symbols $q_1$="1," which have greater reliability than symbols with $q_2$="1." As such, basically, in the signal constellation shown in FIG. 6 the bits $i_1$ and $q_1$ exhibit greater reliability with regard to correctly determining the information content than bits $i_2$ or $q_2$.

For the transmission path structure shown in FIG. 1, the problem which then arises is that on one side bits are provided with different priority or importance for decoding the relevant message, and on the other side the modulator 5 does not transmit bits equally securely or cannot map them to symbols equally reliably. Such is then transferred in the form of a real section Re or its inphase components and its imaginary part or their quadrature components so that, if necessary, bits with higher priority are mapped to symbols with lower reliability and transmitted. This makes the data transmission security and data transmission quality suffer.

In this connection, it already has been suggested for an attempted transmission of a data block that the bits are assigned in a specific way to the symbols 13 of symbol area 12, so that with a skillful application of an assignment specification, matching of the reliability of the individual bits can be achieved after several transmissions. However, this only applies if a data block is repeated several times. The transmission security is not improved by this suggestion for the first transmission of a data block. In addition, with this proposal the different priorities of the channel coder bits are not taken into account. A further problem associated with this suggestion lies in the fact that the repetition data packet does not absolutely have to be identical to the originally transmitted data packet because of the different mapping of the individual bits to the transmitted symbols. The result of this is that on the receiver side the two packet retransmissions can be combined directly before the demodulator, but what is known as a log likelihood combination must be undertaken at bit level. In this case, the received quadrature values are initially converted into the likelihoods for the transmitted bits in order to derive the actually transmitted bits with the greatest possible likelihood. However, the log likelihood combination does not perform as well as the previously mentioned simple symbol combination in which the symbols of the original data packet, weighted with the symbols of the retransmission data packet, are simply added before the demodulator after application of a channel estimation to the relevant signal-to-noise ratio, particularly with bad transmission characteristics. In addition, with the conventional combination of symbols, two items of bit information can be stored in an assigned memory location (for example, of the Inphase component) so that memory space can be saved.

A further proposal is shown in FIG. 2, whereby, after channel coder or turbo coder 2, which output the bits separately as systematic bits S and parity bits P, the systematic bits and parity bits will be processed separately. Therefore, two separate interleavers 4a and 4b are provided in which case, in one device 10, a parallel/serial conversion to just one bit stream takes place so that as intelligent an assignment as possible of the bits with different priorities or importances to the bit positions with differing reliability can be undertaken within the individual symbols. In this case, the bits with the highest priority; (i.e., the systematic bits S), are preferably distributed to the bit positions with the highest reliability and the bits with the lowest priority; (i.e., the parity bits), to the bit positions with the lowest reliability. Since frequently more bits with highest priority than bit positions with highest reliability are present, no optimum solution is possible as a rule. In addition, because of the multiplicity of interleavers and the additional device 10, this variant requires significantly more effort to implement.

An object of the present invention is, therefore, to provide a method for matching the bit rate of a bit stream to be transmitted in a communication system, as well as an associated communication device, in which case the data transmission quality and data transmission security can be improved with the minimum possible effort. In particular, the simplest possible methods and devices should be able to be used to guarantee that the more important bits are mapped to bit positions with high reliability within the individual modulation symbols.

SUMMARY OF THE INVENTION

In accordance with the present invention, it is proposed that, for bit rate matching, a bit rate matching algorithm be used in which for the puncturing or repetition, in particular, the quality or reliability of the bits actually used for transmission, with which for an actual transmission a specific information content can be transferred by the relevant bit, the reliability of the corresponding bit positions within the symbols to be transmitted, is taken into account.

Preferably, a method is provided for an assignment of the bits to be transmitted of the corresponding bit stream to the actual bits available for transmission such that the sum of the reliabilities of the bits available for transmission which correspond to a specific bit of the bit stream is exactly proportional to the importance of the relevant bit. This assignment only can, however, be achieved in practice for special cases (e.g., when all bits are of the same importance and each bit will be repeated with equal frequency, etc.).

Thus, it is proposed in accordance with the present invention, at least over the average of a number of consecutive bits of the bit stream to be transmitted to achieve an exact as possible approximation to the above-described preferred method; i.e., to design the puncturing/repetition in such a way that for a specific number of consecutive bits of the bit stream to be transmitted the sum of the importances of these bits is in as good as possible a fixed relationship to the sum of the reliabilities of the bits used for transmission of these bits.

In accordance with one exemplary embodiment of the present invention, provision is thus made in this regard for increasing the puncturing rate locally (or lowering the repetition rate), if the quotient from the sum of the importances of the bits to be transmitted thus far divided by the sum of the reliabilities of the bits used for transmission is greater than a specified threshold value. Conversely, the local puncturing rate is reduced (or the repetition rate is increased) when the quotient of the sum of the importances of the bits to be transmitted thus far divided by the sum of the reliabilities of the bits used for transmission is smaller than the specified threshold value.

This is achieved, on determining an error value which is a measure of the deviation between the current puncturing or repetition rate and the desired puncturing or repetition rate, by using an updating parameter which is selected bit-specifically for each bit to be used for transmission depending on the reliability with which in a current transmission a specific information content can be transferred by the bit concerned. That is, this updating parameter is not selected as a constant but is changed bit-specifically depending on the quality or reliability of the bits used for transmission, so that with puncturing or repetition the quality or reliability of the bits used for transmission can be taken into account, thus increasing the quality and security of packet data transmission.

It is preferably advantageous if in the bit rate matching algorithm not only the quality and reliability of the bits used for transmission is taken into account but also the importance or priority of the bits of the bit stream to be subjected to bit rate matching. In this connection, a corresponding updating parameter can be used which is chosen bit-specifically individually for each bit of the bit stream for which a decision is to be made with regard to puncturing/repeating. With the aid of the measures described previously, it can be ensured that for a certain quantity of adjacent bits the sum of the importances of the bits to be transmitted is always as good as possible and in a fixed relationship to the sum of the reliabilities of the bits used for transmission.

In accordance with the present invention, a bit rate matching algorithm is used which, in contrast to conventional bit rate matching algorithms, is designed in such a way that both puncturing and repetition can take place simply in a single data block, wherein the different importances and reliabilities of bits within a data block can be taken into account.

Different measures can be taken to obtain the information required for executing the present invention concerning the reliability of the individual bits used for transmission. Thus, for example, for different bit classes of the different importances, separate interleavers can be used whereby the bits of the corresponding bit class output by the interleavers are mapped to specific bit positions with the corresponding reliabilities of the symbols to be transmitted. As such, when bit rate matching is performed, both the importance and the reliability information is available right from the start. Alternatively, the sequence of the reliabilities at the output of the channel coder also can be calculated from the known reliabilities, depending on the type of modulation used in each case, by deinterleaving.

This type of explicit deinterleaving operation can be avoided if the interleaver used in each case implements a simple assignment rule, at least in relation to the assignment of the bits of different bit classes which each exhibit different reliabilities, which can be achieved depending on the modulation type selected in each case by a corresponding embodiment of the relevant interleaver. Preferred exemplary embodiments for this are explained in detail below.

Investigations into turbo coding have revealed that the parity bit streams normally provided by a turbo coder are not entirely equivalent in value, such that it makes sense to transmit the parity bits which are first used in the turbo decoder with a somewhat lower puncturing than the parity bits of the second parity bit stream. Thus, the parity bits of the first parity bit stream could be provided with a somewhat higher importance or priority than the parity bits of the second parity bit stream.

In communication systems in which the ARQ method already explained above is used, the importance or priority of individual bits also can be chosen depending on the number of times that the corresponding data packet has been transmitted.

The present invention is preferably suited for use in mobile radio systems, particularly for use in UMTS mobile radio systems. However, the present invention is, of course, not restricted to this preferred area of application but can be generally used in any communication system where bit rate matching is performed on the transmitter side. In addition, not only the transmitter side but also the receiver side is affected by the present invention, since on the receiver side a received signal processed in accordance with the invention must be evaluated.

Additional features and advantages of the present invention will be described in, and will be apparent from, the following Detailed Description of the Invention and the Figures.

BRIEF DESCRIPTION OF THE FIGURES

FIGS. 5A-5C show possible assignments of deinterleavers which, in accordance with further exemplary embodiments of the present invention, can be used in co-ordination with correspondingly embodied interleavers.

FIG. 6 shows the signal constellation for a 16QAM modulation.

DETAILED DESCRIPTION OF THE INVENTION

Figure 1:
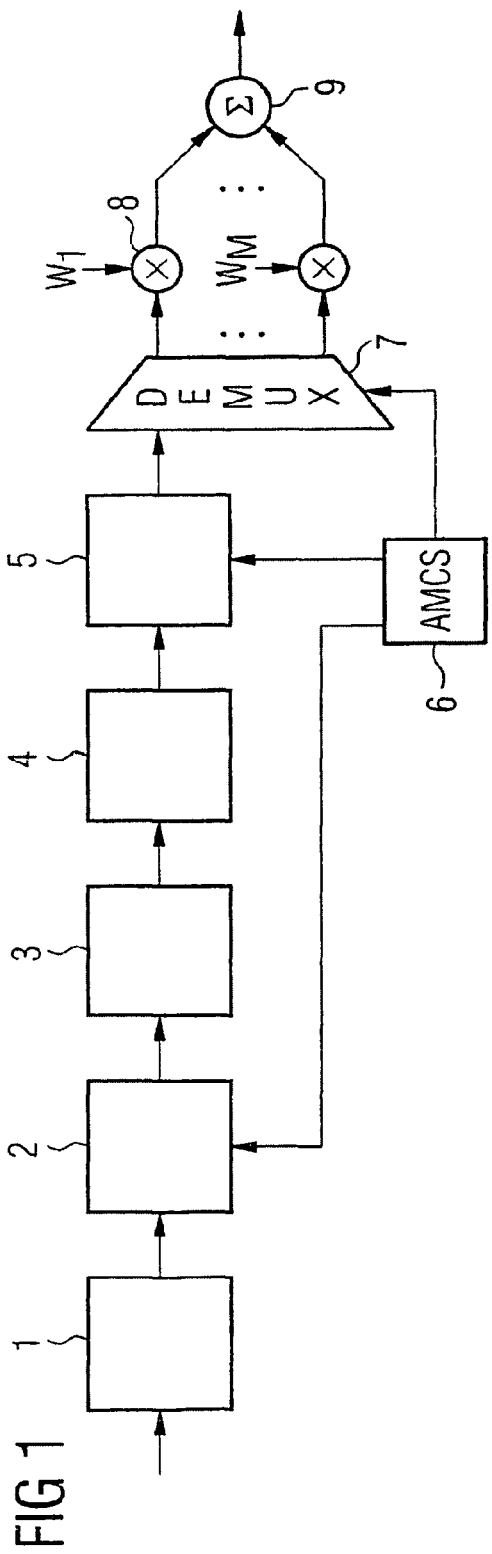
FIG. 1 shows a simplified block diagram of a transmit path structure of a mobile radio transmitter in which the present invention can be employed.
Figures 3, 4:
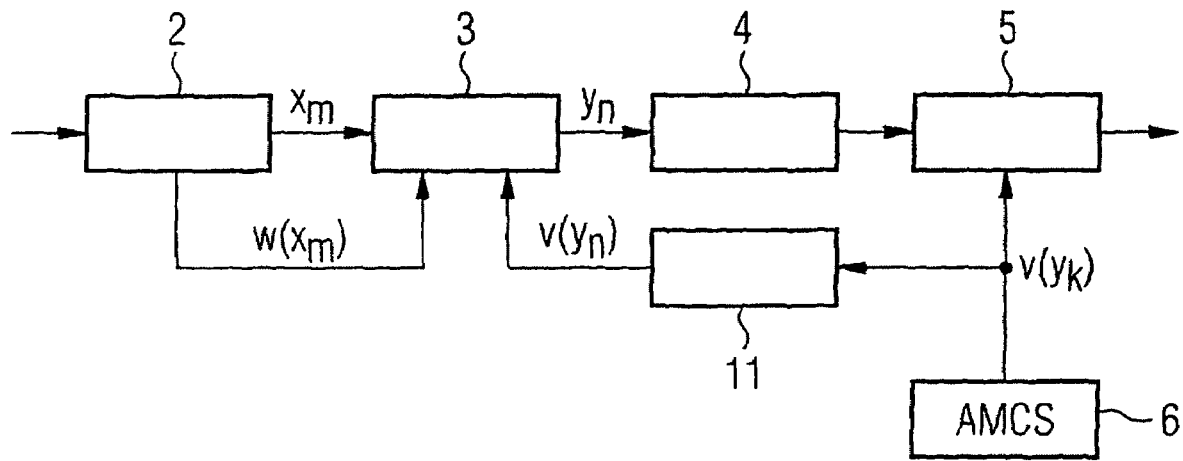
FIG. 3 shows a simplified block diagram of the transmit path structure of a mobile radio transmitter in accordance with a further exemplary embodiment of the present invention.
FIG. 4 shows a bit rate matching algorithm in accordance with a preferred exemplary embodiment of the present invention.

FIG. 4 shows a bit rate matching algorithm in accordance with a preferred exemplary embodiment of the present invention, such as can be used in the bit rate matching device 3 of the transmitter shown in FIG. 1. With regard to the function and method of operation of the individual components shown in FIG. 1, reference should be made here to the additional information provided above.

The bit rate matching algorithm is based on the calculation of an error value e, which is a measure for the deviation between the current puncturing or repetition rate and the desired puncturing or repetition rate, in which case, with the bit rate matching algorithm shown in FIG. 4, two updating parameters $e_{minus}$ and $e_{plus}$ are used, with the aid of which the error value is either reduced by $e_{minus}$ or increased by $e_{plus}$. Evaluating the error value e updated in this way in each case allows an assessment to be made of whether (and if so, how often) the relevant bit is to be transmitted or not.

In this case, the fact that each of the bits $x_m$ fed to the bit rate matching device 3 is assigned a specific importance or priority, $w(x_m)$ is taken as the starting point, with the importance or priority representing the relevance of the relevant bit for decoding and recovery of a corresponding message on the receiver side. The larger the value $w(x_m)$ of a bit $x_m$ the greater the importance of the corresponding bit. The importance of the individual bits $x_m$ thus can differ, particularly with turbo coding since it is known that the systematic bits delivered by turbo coders are more important for the decodability of the corresponding message than the less important parity bits. With a folding encoder, the bits at the start and at the end, for example, carry a lower information content and thus can be given a lower importance. The sum of the importances of the individual bits of a data packet having N bits produces a parameter K:

$$\sum_{m=1}^{N} w(x_m) = K \tag{1}$$

Conversely it will be assumed that for each transmission bit (i.e., each bit $y_n$ output by the bit rate matching device 3), a reliability or quality $v(y_n)$ is defined with which the information content of the bit can be transferred. As has, already has been explained on the basis of FIG. 6, a number of bits are assigned to a specific symbol as a rule by the modulation of the modulator 5 shown in FIG. 1, in which case, however, the reliability or security of the individual bits within these symbols is not identical, with many bits being able to be transmitted more securely than others. In addition, the bits can be transmitted with different power, the noise power can be different at the point of transmitting the bits or the individual bits can be at different distances from a training sequence or from pilot symbols which are used for channel estimation or can exhibit different reliabilities because of other circumstances. Each output bit of bit rate matching device 3 (i.e., each bit to be transmitted $y_n$), is thus assigned a bit-specific value $v(y_n)$, in which case the reliability of the output bit $y_n$ decreases with the increase in value of $v(y_n)$. The sum of the reliabilities of all Nc bits of a data packet output from bit rate matching device 3 produces a parameter L:

$$\sum_{n=1}^{Nc} v(y_n) = L \quad (2)$$

Depending on the relationships defined in the above formulae (1) and (2), a bit-specific updating parameter $e_{minus}(m)$ is defined for each input bit $x_m$ as follows:

$$e_{minus}(m) = w(x_m) \cdot L \quad (3)$$

Likewise, for each output bit $y_n$ of the bit rate matching device 3 (i.e., for each bit to be transferred), a bit-specific updating parameter $e_{plus}(n)$ is defined as follows:

$$e_{plus}(n) = v(y_n) \cdot K \quad (4)$$

These bit-specific updating parameters will be used for the bit rate matching algorithm shown in FIG. 4 as follows.

In a step 100 the error value e is initially set to an initial value eini which represents the error between the actual and the desired puncturing/repetition rate at the beginning of the process. To make matters simpler, this initial value eini normally has the value 1. Subsequently, in a step 101, the index of the currently observed bits is set to 1, whereas in a step 102, the index of the bit output from the bit rate matching unit 3 for the relevant data packet is also set to index 1. Then the sequence embedded in a WHILE loop 103 is executed for all N bits of the relevant data packet. In this case, in a step 104, the error value e is updated for the bit $x_m$, in which case the difference between the current error value and the specific updating parameter $e_{minus}(m)$ for the relevant bit $x_m$ is calculated. If the result $e \leq 0$ (step 105), the corresponding bit $x_m$ will be selected for transmission and thereby released for transmission by the bit rate matching device 3 or output to the interleaver 4 (step 106). Subsequently, the corresponding error value e is increased by the specific updating parameter for the relevant bit to be transmitted or for the relevant output bit $e_{plus}(n)$ (step 107) and the index of the output bit incremented (step 108). It can be seen from FIG. 4 that by steps 105-108 the corresponding bit $x_m$ is selected for transmission and the corresponding error value increased by $e_{plus}(n)$ until the error value e has reached a value greater than zero. As such, the bit $x_m$ will not be selected at all for transmission and thereby punctured if the error value e updated in step 104 is already greater than zero before the execution of the loop with steps 105-108. On the other hand, for the case where after step 104 the error value $e \leq 0$, bit $x_m$ is repeated exactly as many times as the error value e can be increased to reach the value zero by $e_{plus}(n)$. After conclusion of the loop with steps 105-108 the index m of the input bit of the bit rate matching device 3 is increased (step 109) and the procedure for the new input bit is executed again, starting at step 104.

With the bit rate matching algorithm shown in FIG. 4, the areas in which bits are to be punctured and the areas in which bits are to be repeated can be controlled by variation of parameters $e_{minus}$ and $e_{plus}$. Puncturing generally takes place in those areas in which $e_{minus} < e_{plus}$, whereas conversely a repetition is performed where $e_{minus} \geq e_{plus}$.

The updating parameter $e_{plus}$ can be selected so that it is proportional to the information content or the transmission quality of the relevant output bit of bit rate matching device 3.

Figure 2:
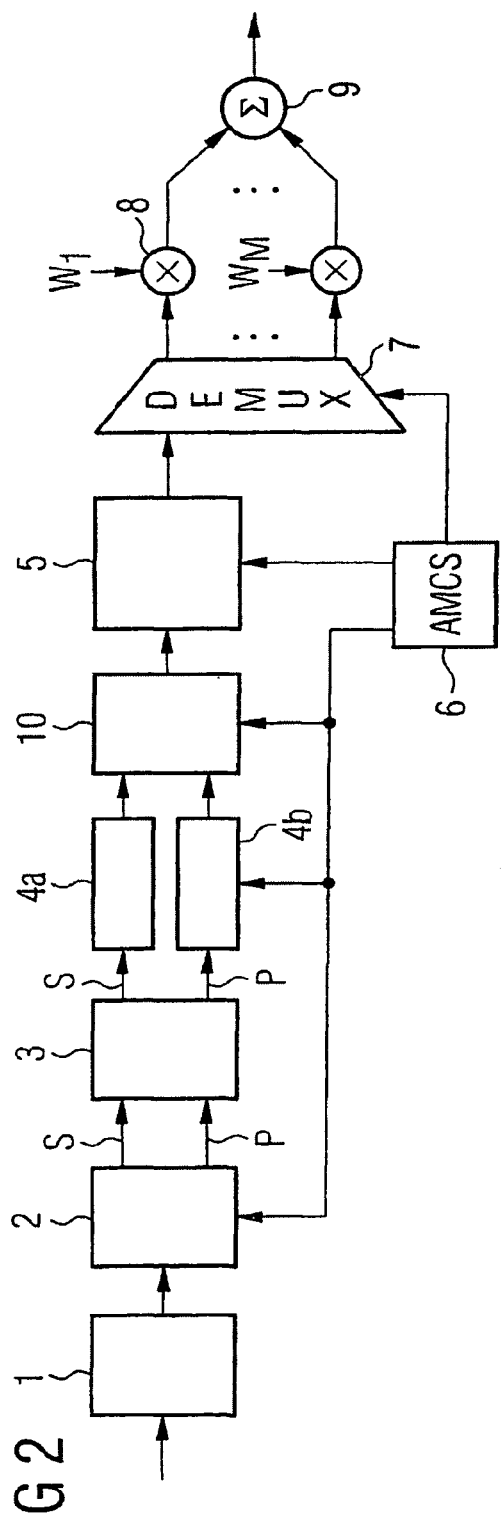
FIG. 2 shows a simplified block diagram of the transmit path structure of a mobile radio transmitter in accordance with a further exemplary embodiment of the present invention.

To implement the bit rate matching algorithm explained above, the bit rate matching device 3 must already know when executing the bit rate matching algorithm about the reliability or quality $v(y_n)$ of the bits $y_n$ used for transmission, i.e., for example, the "gray mapping" scheme of the modulator 5 provided in each case for mapping the bits to be transmitted to the corresponding symbols. This can be problematic to the extent that between the bit rate matching device 3 and the modulator 5 the interleaver 4 shown in FIG. 1 is normally provided which performs a temporal rearrangement of the bit sequence output by the bit rate matching device 3. This problem can, however, be resolved if the influence of interleaver 4 is taken into account. To simplify matters, however, separate interleavers 4a, 4b may be used for each bit class, in which bits with the same reliability $v(y_n)$ or quality are grouped together, as already has been explained previously on the basis of FIG. 2. For a 16QAM modulation (compare FIG. 6), only two separate interleavers 4a, 4b are thus necessary since there are only two different reliabilities of the individual bit positions within the symbols shown in FIG. 6 and thus two different bit classes. Since each interleaver 4a, 4b is assigned to a bit class in each case, the bit rate matching device 3 implicitly knows about the reliability of the two output bit streams.

If, on the other hand, separate interleavers are not to be used, the sequence of reliabilities $v(y_n)$ at the output of the channel coder 2 can be calculated by deinterleaving with the aid of a deinterleaver 11 from the known reliabilities $v(y_k)$ of the type of modulation used in each case, with n being the index of the bits output by the bit rate matching device 3 and k the bit index after the interleaver 4. A corresponding exemplary embodiment is shown in FIG. 3, in which case the importances or priorities $w(x_m)$ of the input bits $x_m$ of the bit rate matching device 3 can be derived from the channel coder or turbo coder 2.

An explicit deinterleaving operation can be avoided if, in the interleaver 4 shown in FIG. 4, a simple assignment rule is implemented at least in relation to the assignment of the individual output bits of the bit rate matching device 3 which exhibit different reliabilities.

The most simple achievement of this principle is when the function of interleaver 4 causes the order of the bits with different reliabilities (i.e., the order of the different bit classes), to remain unchanged. If modulation by modulator 5, such as with a 16QAM modulation, causes alternate bits with low and high reliability to occur, this consequently also the case before interleaver 4, so that the bit rate matching device 3 can easily draw conclusions as a result of the order of the bit output or as a result of the bit index n about the inherent reliability $v(y_n)$ in each case. This can be achieved relatively easily for the block interleavers currently used for UMTS mobile radio systems with a column exchange in which the individual bits are written in row by row and read out column by column, if the number of columns is not divisible by the number of the different reliability depending on the type of modulation selected. If, in addition, the number of rows of the block interleaver is not divisible by the number of different reliabilities (i.e., the number of the bit classes), a suitable column exchange can achieve an assignment in which the order of the modulation bits is always alternating, whereas otherwise it is alternating within one column of the interleaver; i.e., there are only a few "collision points" where this defined order is interrupted. These few "collision points" do not, however, interfere with the process since with a suitable choice of column exchange operation the number of the collision points can be kept small.

Figures 5, 6:
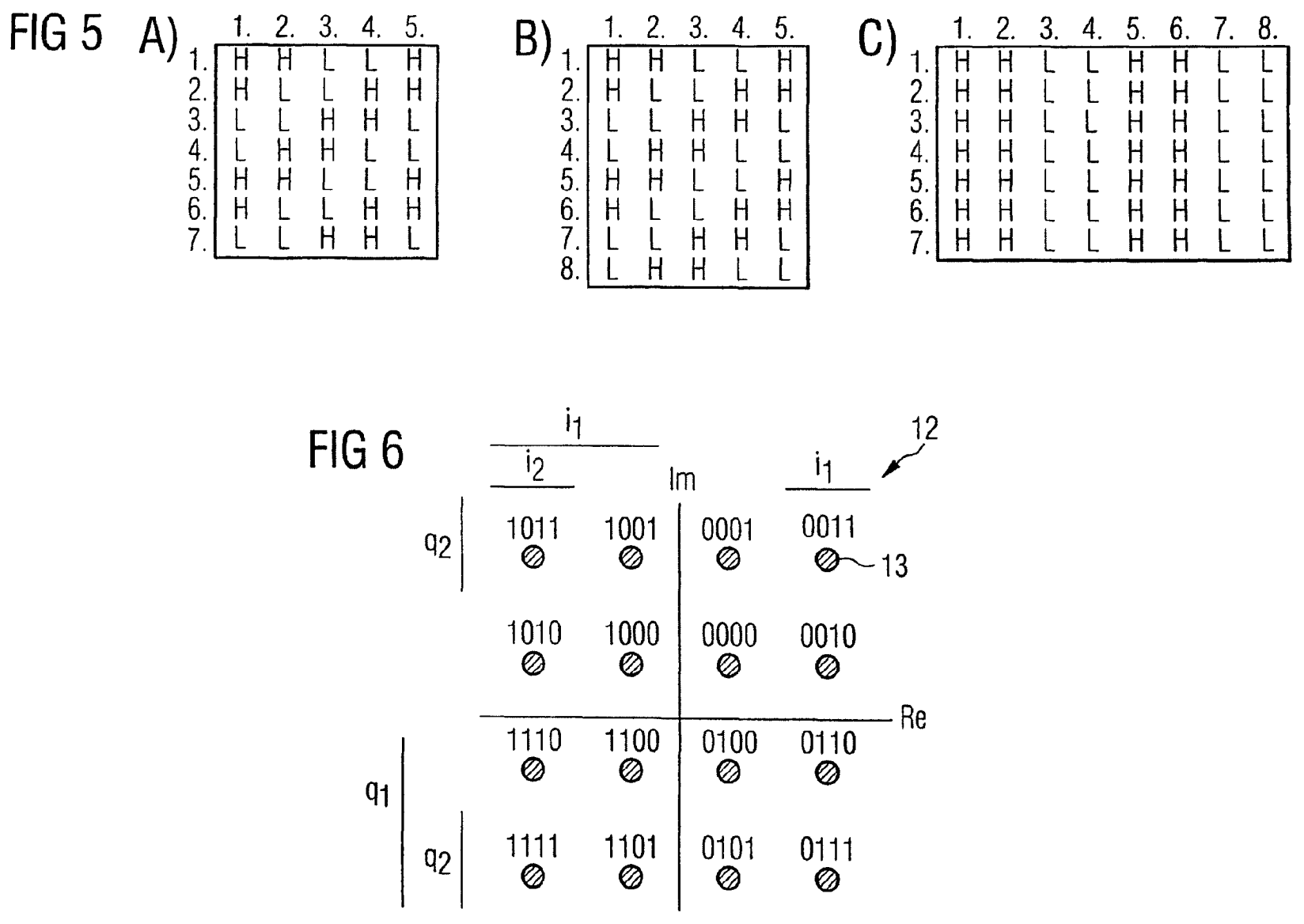

This type of interleaver operation is shown for the example of a 16QAM-modulation in FIG. 5A, which does not show interleaver 4 itself but the associated deinterleaver 11; i.e., the input data has the order of the bit reliabilities $v(y_k)$ at modulator 5, in which case the sought order $v(y_n)$ of the reliabilities for the bit rate matching device 3 is output by deinterleaving 11. With the example shown in FIG. 5A the memory of the deinterleaving is filled up row by row and read out column by column, in which case the rows will be written in the order 1, 2, 3, 4, 5, 6, 7 and the columns will be read in the order 1, 4, 3, 2, 5 (which corresponds to the column exchange previously mentioned). With a 16QAM modulation, as has already been explained, there are only two bit classes with different reliability, in which case the reliable bit positions in FIG. 5 are marked ("High Reliability") and the less reliable are marked L ("Low Reliability"). At modulator 5, a sequence of two H bits and two L bits are grouped together into a modulation symbol in each case. For the example shown in FIG. 5A, the number of different bit classes (two) and the number of rows (seven) and columns (five) are not divisible. If the columns, as previously specified, are read out in the order 1, 4, 3, 2, 5, the alternating sequence of two H bits and two L bits is produced in each case before as well as after interleaver 4. That is, the functionality of interleavers 4 is transparent and it is very easily possible to assign the individual reliabilities $v(y_n)$ to the individual output bits of bit rate matching device 3.

A similar example is shown in FIG. 5B, in which case there is provided with eight rows instead of seven rows so that the previously described indivisibility is no longer present. If the individual rows are read out in the order 1, 5, 2, 3, 4, the alternating sequence of two H bits and two L bits cannot be adhered to exactly. In general, there no longer exists any read sequence for which this specified alternating sequence can be exactly adhered to. However, the alternating sequence is retained within a column, in which case irregularities merely occur at the "collision points" between two columns (e.g., between columns 5 and 2, between columns 2 and 3 and between columns 3 and 4).

Another simple arrangement provides for bits $y_n$ with the same reliability $v(y_n)$ to follow each other directly. This can be achieved if the number of columns of interleaver 4 is divisible by the number of different bit classes in which the bits with different reliabilities are grouped together. In addition the column exchange of interleaver 4 can be selected in such a way as to achieve this type of assignment.

A corresponding example is shown in FIG. 5C, which does not show interleaver 4 but the associated deinterleaver 11. The number of columns (eight) is divisible by the number of different bit classes (two with a 16QAM modulation). Through a suitable read sequence, such as, by reading the columns in the sequence 1, 5, 2, 6, 3, 7, 4, 8, a grouping of the H and L bits can be achieved so that it also is simple for bit rate matching device to draw conclusions about the associated bit reliability v(y.sub.n) depending on the index n of the bits output and provided for transmission as well as based on the knowledge of the interleaver structure.

With the aid of the present invention, as described in detail above, both the importance and the priority of the individual bits $x_m$ of the bit stream which is to be subjected to a bit rate matching as well as the reliability or quality of the bits $y_n$ which are provided for transmission after execution of the bit rate matching, can be taken into account in a bit rate matching so that, depending on the relevant operational or transmission conditions, an optimum bit rate matching can be undertaken.

In this case, especially for communication systems with ARQ methods in which, if the data is received incorrectly by the receiver, a new transmission can be requested from the transmitter, the importance or priority of the individual bits $x_m$ used is selected depending on the number of times that the corresponding data packet has been transmitted. This is interesting because with turbo coding the systematic bits with the first transmission are more important than the parity bits whereas for a repetition of this transmission such difference is less or the parity bits can be even more important. With this measure, it also can be achieved that for each transmission of a data block (partly) different bits will be used. So both what are known as filter methods ("Incremental Redundancy"), in which repeatedly transmitted data packets are merely partly identical to the originally transmitted data packet and also what is known as the "Chase Combining" methods, in which the bits of all repetition packets are identical with the original data packet, can be achieved by the present invention. If repetition is used in preference to puncturing, although with the aid of the previously suggested method the same bits are always sent, (partly) different bits are repeated in the various transmissions of the relevant data block. Therefore, an additional memory location is not needed.

Although the present invention has been described with reference to specific embodiments, those of skill in the art will recognize that changes may be made thereto without departing from the spirit and scope of the present invention as set forth in the hereafter appended claims.

The invention claimed is:

1. A method for matching a bit rate of a bit stream to be transmitted in a communication system, the method comprising the steps of:

assigning bits of the bit stream to be transmitted for matching of the bit rate to bits actually used for a transmission, wherein, for a specific number of consecutive bits of the bit stream to be transmitted in each case, a sum of importances, which the relevant bits of the bit stream exhibit for a recovery of a message containing the relevant bits, is in a specified relationship to a sum of reliabilities of corresponding bits actually used for the transmission;

matching the bit rate by one of puncturing and repeating the relevant bits of the bit stream, wherein with puncturing the relevant bits are removed and with repeating the relevant bits are multiplex;

increasing or decreasing a respective puncturing or repetition rate with which the relevant bits of the bit stream are punctured or repeated for bit rate matching when, for the specific number of consecutive bits of the bit stream, a quotient of the sum of importances, and the sum of the reliabilities of the corresponding bits actually used for the transmission, is greater than a specified threshold value;

decreasing or increasing the respective puncturing or repetition rate with which the relevant bits of the bit stream are punctured or repeated for bit rate matching when the quotient is smaller than the specified threshold value; and transmitting, via the corresponding bits and after executing bit rate matching, specific information content.

2. A method for matching a bit rate of a bit stream to be transmitted in a communication system as claimed in claim 1, the method further comprising the steps of:

using, for each relevant bit, an updated error value which is a measure of deviations between a current puncturing or repetition rate and a desired puncturing or repetition rate and is a basis of a corresponding error value previously determined by at least one variable updating parameter and on a basis of the updated error value, for assessing whether the relevant bit is to be punctured or repeated; and selecting the at least one variable updating parameter in each case depending on the reliability with which the relevant bits of the bit stream can transmit the specific information content after execution of the bit rate matching.

3. A method for matching a bit rate of a bit stream to be transmitted in a communication system as claimed in claim 2, the method further comprising the step of using, for determining the updated error value, a further bit-specific updating parameter which is selected for each relevant bit of the bit stream depending on the importance which the relevant bit of the bit stream has for recovery of the message containing the relevant bit of the bit stream.

4. A method for matching a bit rate of a bit stream to be transmitted in a communication system as claimed in claim 3, the method further comprising the step of subjecting the bit stream to channel coding before execution of the bit rate matching, wherein the importance corresponds to an importance which the relevant bit of the bit stream has for decoding of the message containing the relevant bit of the bit stream.

5. A method for matching a bit rate of a bit stream to be transmitted in a communication system as claimed in claim 3, wherein for bit rate matching of a data packet having N bits, the sum of the importances of the bits of the data packet corresponds to a value K, wherein for output of Nc bits provided for transmission after execution of the bit rate matching based on the data packet, the sum of the reliabilities of all Nc output bits corresponds to a value L, wherein as updating parameter for an output bit number n, a product of the value of the reliability with which bit number n may transfer the specific information content and the value K are used, and wherein as a further updating parameter for a bit number m of the bit stream a product of the value of the importance of bit number m and the value L are used.

6. A method for matching a bit rate of a bit stream to be transmitted in a communication system as claimed in claim 3, the method further comprising the steps of:

determining the updated error value of each bit from the difference between the corresponding error value previously determined and the further updating parameter;

selecting, when the updated error value is not greater than a specific reference value, the relevant bit for transmission; and updating the updated error value for the relevant bits in each case by forming the sum with the updating parameter until a resulting error value is greater than the reference value.

7. A method for matching a bit rate of a bit stream to be transmitted in a communication system as claimed in claim 6, wherein the reference value is zero.

8. A method for matching a bit rate of a bit stream to be transmitted in a communication system as claimed in claim 3, the method further comprising the steps of:

transmitting, after the bit rate matching, the corresponding bits to a receiver; and requesting, via the receiver and on incorrectly receiving a data packet including the corresponding bits, a new transmission of the relevant data packet, wherein the importance of the relevant bits of the bit stream which is subjected to bit rate matching is selected to depend on a number of times the data packet to which the corresponding bits belong will be transmitted.

9. A method for matching a bit rate of a bit stream to be transmitted in a communication system as claimed in claim 1, the method further comprising the step of executing, after bit rate matching, an interleaving of the corresponding bits actually intended for transmission after bit rate matching, wherein for each group of bits in which the corresponding bits intended for transmission are grouped together with an identical reliability, a separate interleaving process is executed so that to perform the bit rate matching for each corresponding bit intended for transmission of the corresponding reliability it is derived from each corresponding bit to which interleaving process the corresponding bit will be directed.

10. A method for matching a bit rate of a bit stream to be transmitted in a communication system as claimed in claim 1, wherein the reliabilities for the corresponding individual bits actually intended for transmission after execution of the bit rate matching are derived from known reliabilities with which the corresponding bits are mapped with a modulation to corresponding modulation symbols to be transmitted.

11. A method for matching a bit rate of a bit stream to be transmitted in a communication system as claimed in claim 10, wherein after the bit rate matching and before the modulation, interleaving is executed wherein the reliabilities of the corresponding bits output from bit rate matching and actually intended for transmission are derived from the known reliabilities of the modulation by de-interleaving.

12. A method for matching a bit rate of a bit stream to be transmitted in a communication system as claimed in claim 1, wherein interleaving is performed after the bit rate matching such that a sequence of the corresponding bits actually intended for transmission remains unchanged regarding their respective reliabilities so that to execute the bit rate matching the reliability for the corresponding bits actually intended for transmission after the bit rate matching is derived from an index with which each corresponding bit is output by bit rate matching.

13. A method for matching a bit rate of a bit stream to be transmitted in a communication system as claimed in claim 12, the method further comprising the step of using a block interleaver with columns and rows for interleaving, wherein a number of columns of the block interleaver is indivisible by a number of different reliabilities of the corresponding bits.

14. A method for matching a bit rate of a bit stream to be transmitted in a communication system as claimed in claim 13, wherein the number of rows of the block interleaver is indivisible by the number of different reliabilities.

15. A method for matching a bit rate of a bit stream to be transmitted in a communication system as claimed in claim 1, wherein after the bit rate matching, an interleaving is performed such that a specific number of corresponding bits with the same reliability always will be output for transmission by the interleaving so that, to execute the bit rate matching, the reliability of the actual corresponding bit to be transmitted in each case is derived from an index with which the corresponding bit is output by the bit rate matching.

16. A method for matching a bit rate of a bit stream to be transmitted in a communication system as claimed in claim 15, wherein the interleaving is performed with a block interleaver with rows and columns, wherein a number of columns of a block interleaver is divisible by a number of different reliabilities.

17. A communication device for transmission of a bit stream over a transmission channel, comprising:
   a bit rate matching device for matching a bit rate of the bit stream to be transmitted,
      wherein the bit rate matching device assigns relevant bits of the bit stream to be transmitted for matching the bit rate to corresponding bits actually used for the transmission,
      wherein, for a specific number of consecutive bits of the bit stream to be transmitted in each case, a sum of importances, which the relevant bits of the bit stream exhibit for a recovery of a message containing the relevant bits, is in a specified ratio to a sum of reliabilities of the corresponding bits actually used for the transmission with which the corresponding bits transfer specific information content after execution of the bit rate matching,
      wherein the matching of the bit rate is undertaken by puncturing or repeating the relevant bits of the bit stream, wherein the puncturing removes specific bits and repetition multiples specific bits,
      wherein a puncturing or repetition rate, with which the relevant bits of the bit stream are punctured or repeated for bit rate matching, is increased or reduced when a quotient of the sum of the importances of the specific number of consecutive bits of the bit stream, and the sum of the reliabilities of the corresponding bits actually used for the transmission, is greater than a specified threshold value,
      and wherein the puncturing or repetition rate with which the bits of the bit stream are punctured or repeated for bit rate matching is increased or reduced when the quotient is less than the specified threshold value.

18. A communication device for transmission of a bit stream over a transmission channel as claimed in claim 17, wherein the communication device is a mobile radio transmitter.

19. A communication system for transmission and reception of a bit stream over a transmission channel, comprising:
   a bit rate matching device that matches a bit rate of the bit stream to be transmitted,
      wherein the bit rate matching device assigns relevant bits of the bit stream to be transmitted for matching the bit rate to corresponding bits actually used for the transmission such that, for a specific number of consecutive bits of the bit stream to be transmitted, a sum of importances, which the relevant bits of the bit stream exhibit for a recovery of a message containing the relevant bits, is in a specified ratio to a sum of reliabilities of the corresponding bits actually used for the transmission with which the corresponding bits transfer specific information content after execution of the bit rate matching,
      wherein the matching of the bit rate is undertaken by puncturing or repeating the relevant bits of the bit stream, wherein puncturing removes specific bits and repetition multiples specific bits, wherein the puncturing or repetition rate with which the relevant bits of the bit stream are punctured, or repeated for bit rate matching, is increased or reduced when a quotient of the sum of the importances for the specific number of consecutive bits of the bit stream, and the sum of the reliabilities of the corresponding bits actually used for the transmission, is greater than a specified threshold value,
      and wherein the puncturing or repetition rate with which the bits of the bit stream are punctured or repeated for bit rate matching is increased or reduced when the quotient is less than the specified threshold value; and
   a communication device for receiving and evaluating the bit stream transmitted.

20. A communication system for transmission and reception of a bit stream over a transmission channel as claimed in claim 19, wherein the communication device is a mobile radio receiver.

* * * * *